US009598279B2

(12) United States Patent
Zhang et al.

(10) Patent No.: US 9,598,279 B2
(45) Date of Patent: Mar. 21, 2017

(54) SEMICONDUCTOR STRUCTURES AND FABRICATION METHODS THEREOF

(71) Applicant: Semiconductor Manufacturing International (Shanghai) Corporation, Shanghai (CN)

(72) Inventors: Xianming Zhang, Shanghai (CN); Jingxiu Ding, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/800,777

(22) Filed: Jul. 16, 2015

(65) Prior Publication Data
US 2016/0060097 A1    Mar. 3, 2016

(30) Foreign Application Priority Data
Aug. 29, 2014   (CN) .......................... 2014 1 0437369

(51) Int. Cl.
*H01L 21/00* (2006.01)
*B81C 1/00* (2006.01)
*H01L 41/113* (2006.01)

(52) U.S. Cl.
CPC ........ *B81C 1/00182* (2013.01); *H01L 41/113* (2013.01)

(58) Field of Classification Search
CPC . H01L 41/113; H01L 41/1132; H01L 41/0906
See application file for complete search history.

(56) References Cited

U.S. PATENT DOCUMENTS 7,951,636 B2 *   5/2011   Lee ..................... B81C 1/00182
                                                      257/419
8,729,646 B2 *   5/2014   Chu ...................... B81B 3/0059
                                                      257/415

* cited by examiner

*Primary Examiner* — Cuong Q Nguyen
(74) *Attorney, Agent, or Firm* — Anova Law Group, PLLC

(57) ABSTRACT

A method for forming a semiconductor structure is provided. The method includes providing a substrate having a device region; and forming a sacrificial layer on a surface of the substrate in the device region. The method also includes forming a device layer having a plurality of openings exposing a portion of the surface of the sacrificial layer on the sacrificial layer; and removing the sacrificial layer to expose the surface of the substrate in the device region. Further, the method includes forming a cavity in the substrate in the device region by simultaneously etching the surface of the substrate in the device region exposed by the removed sacrificial layer and the plurality of openings using an anisotropic etching process.

15 Claims, 5 Drawing Sheets

SEMICONDUCTOR STRUCTURES AND FABRICATION METHODS THEREOF

CROSS-REFERENCES TO RELATED APPLICATIONS

This application claims the priority of Chinese patent application No. 201410437369.9, filed on Aug. 29, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

Micro-Electro Mechanical Systems (MEMSs) are a type of integrated devices used for acquiring information, processing information, and executing operations, etc. Sensors are a typical type of MEMS devices; and are referred as MEMS sensors. MEMS sensors are able to receive certain types of external information, such as pressure, position, velocity, acceleration, magnetic field, temperature, and humidity, etc. Further, the MEMS sensors are also able to covert the external information into electrical signals such that the external information can be processed in a computer system. The typical MEMS sensors include temperature sensors, pressure sensors, and humidity sensors, etc.

In order to obtain the external information, a cavity is often formed in a MEMS device to connect with the external environment. The external liquid or gas is able to enter into the cavity. Thus, the information of the gas or liquid entering into the cavity, such as pressure, temperature, or humidity, etc., is obtained.

FIG. 1 illustrates a semiconductor structure having a cavity. The semiconductor structure is used as a humidity sensor. The semiconductor structure includes a single crystal silicon substrate 100; and a silicon oxide layer 101 formed on the surface of the single crystal silicon substrate 100. Two openings 102 penetrating through the silicon oxide layer 101 are formed in the silicon oxide layer 101. The semiconductor structure also includes a cavity 103 formed in the single crystal silicon substrate 100 under the silicon oxide layer 101 and between the two openings 102.

The silicon oxide layer 101 is a humidity sensitive material. With the changing of the humidity of the air entering into the cavity 103, the dielectric constant of the silicon oxide layer 101 changes correspondingly. By measuring the dielectric constant of the silicon oxide layer 101, the humidity of the air is obtained.

However, the morphology of the cavity formed by existing methods may not match designed requirements. Thus, information obtained by the MEMS having the cavity may be inaccurate. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate having a device region; and forming a sacrificial layer on a surface of the substrate in the device region. The method also includes forming a device layer having a plurality of openings exposing a portion of the surface of the sacrificial layer on the sacrificial layer; and removing the sacrificial layer to expose the surface of the substrate in the device region. Further, the method includes forming a cavity in the substrate in the device region by simultaneously etching the surface of the substrate in the device region exposed by the removed sacrificial layer the plurality of openings using an anisotropic etching process.

Another aspect of the present disclosure includes a semiconductor structure. The semiconductor structure includes a substrate having a device region; and a cavity formed in the substrate in the device region. The semiconductor structure also includes a device layer formed on a surface of the substrate with a portion suspended over the cavity. Wherein the cavity is formed by sequentially forming a sacrificial layer on the surface of the substrate in the device region; forming the device layer having a plurality of openings exposing the sacrificial layer on the sacrificial layer; removing the sacrificial layer to expose the surface of the substrate in the device region; and etching the surface of the substrate in the device region using an anisotropic etching process.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described previously, the morphology of the cavity of the MEMS formed by existing methods may not match the desired requirements. The external information obtained by the MEMS having such a cavity may be inaccurate.

Figure 1:
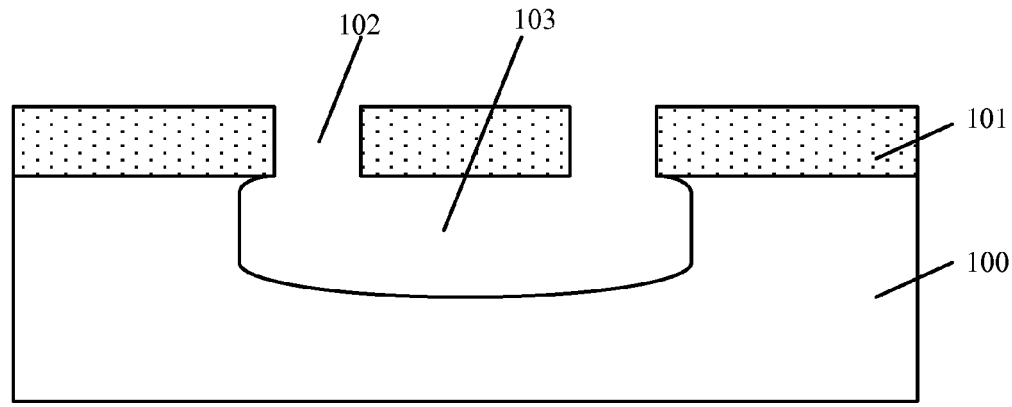
FIG. 1 illustrates a semiconductor structure having a cavity used as a humidity sensor.
Figure 2:
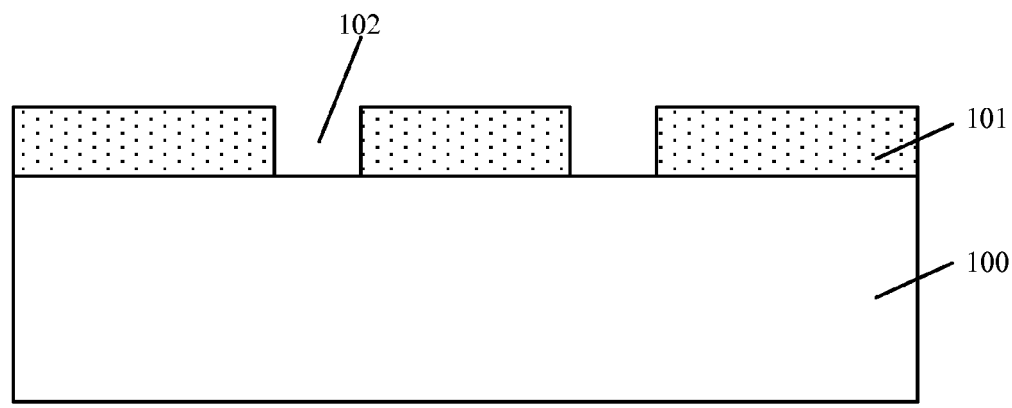
FIGS. 2~3 illustrate structures corresponding to certain stages of an existing fabrication process of a semiconductor structure.
Figure 3:
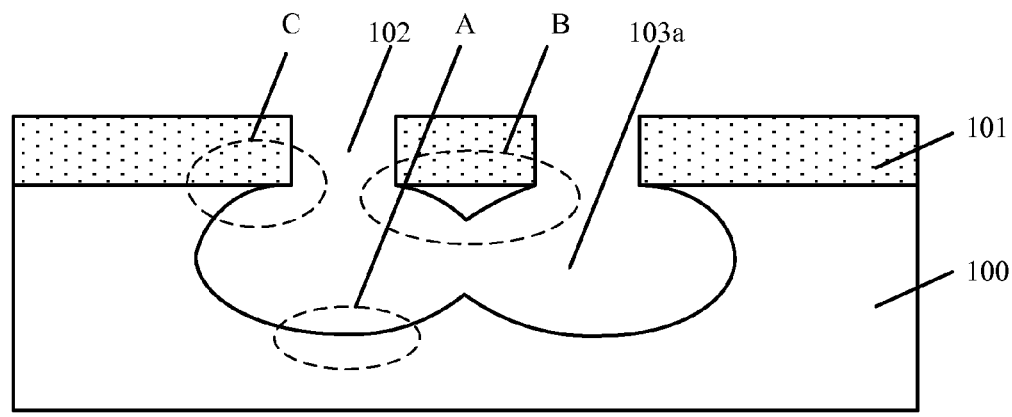

FIGS. 2~3 illustrate certain structures corresponding certain stages of an existing process for forming the structure illustrated in FIG. 1. As shown in FIG. 2, the process may include providing a single crystal silicon substrate 100; and forming a silicon oxide layer 101 on the surface of the single crystal silicon substrate 100. The silicon oxide layer 101 may have two openings 102 exposing portions of the surface of the single crystal silicon substrate 100.

Further, as shown in FIG. 3, the process may include removing the portion of the single crystal substrate 100 under the silicon oxide layer 101 and between the two openings 102 by using an isotropic dry etching process. Thus, a cavity 103a may be formed.

The etching gas of the isotropic dry etching process may include $XeF_2$. The free path of the etching gas may be relatively large. Thus, the etching gas may have relatively large etching rate along all the etching directions. Therefore, the cavity 103a formed by $XeF_2$ etching may have a concave arc surface. Further, the inner surface of the cavity 103 may have random crystal orientations. As shown in the region "A" of FIG. 3, the random crystal orientation may cause the inner surface of the cavity 103a to be relatively rough. The rough inner surface of the cavity 103a may affect the accuracy of the external information obtained by a MEMS having the cavity 103a.

Further, when the isotropic dry etching process is used to etch the single crystal substrate 100 to form cavity 103a, the isotropic dry etching process may also etch the single crystal substrate 100 along the direction parallel to the surface of the single crystal substrate 100. Thus, as shown in the region C of FIG. 3, a relatively large undercut may be formed on the side surface of the cavity 103a. The undercut may cause a portion of the silicon oxide layer 101 formed on the single crystal substrate 100 around the cavity 103 to be suspended over the cavity 103a. The suspended portion of the silicon oxide layer 101 may be easy broken, or collapsed. Thus, the performance of the MEMS having the cavity 103a may be affected.

Figure 4:
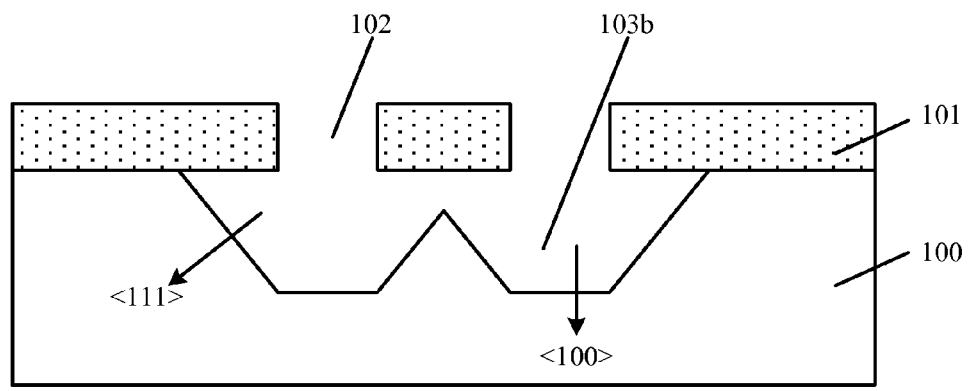
FIG. 4 illustrates another exemplary semiconductor structure having a cavity.

In order to overcome above mentioned issues, another fabrication process is provided. FIG. 4 illustrates a corresponding semiconductor structure. As shown in FIG. 4, the semiconductor structure may be formed by etching the semiconductor structure illustrated in FIG. 2 by an anisotropic wet etching process. Specifically, an anisotropic wet etching process may be used to remove portions of the single crystal substrate 100 under the openings 102, and the portion of the single crystal substrate 100 under the silicon oxide layer 101 between the two openings 102. Thus, a cavity 103b connecting the bottoms of the two openings 102 is formed.

The anisotropic wet etching process may have different etching rates along different crystal orientations. For example, the anisotropic wet etching process may have a relatively large etching rate along the <110> crystal orientation and the <100> crystal orientation. The anisotropic wet etching process may have a relatively small etching rate along the <111> crystal orientation. Thus, referring to FIG. 4, the side surfaces of the cavity 103b formed by the anisotropic wet etching process may have constant crystal orientations. Therefore, the side surfaces of the cavity 103b may be significantly smooth. Further, the anisotropic wet etching process may entirely remove the portion of the single crystal substrate 100 under the silicon oxide layer 101 between the two openings 102.

However, the bottoms of the openings 102 may only expose a small portion of the surface of the single crystal silicon substrate 100. Referring to FIG. 4, if the crystal orientation of the surface of the single crystal substrate 100 is <100>, the side surface of the opening (not shown) formed in the surface of the single crystal substrate 100 by the anisotropic wet etching process may have a <111> crystal orientation; and the crystal orientation of the bottom surface of the opening may be <100>.

The anisotropic wet etching process may have a significantly low etching rate to the <111> crystal orientation. In order to form the cavity 103b connecting the bottoms of the two openings 102, it may take significantly long to remove the portion of the single crystal substrate under the silicon oxide layer 101 between the two openings 102. For example, when the distance between two openings 102 is approximately 5 μm, it may take approximately 120 mins to form the cavity 103b. According to the disclosed device structures and processes, the above mentioned issues may be overcome by forming a sacrificial layer on the surface of the substrate under a portion of the silicon oxide layer between two openings.

Figure 8:
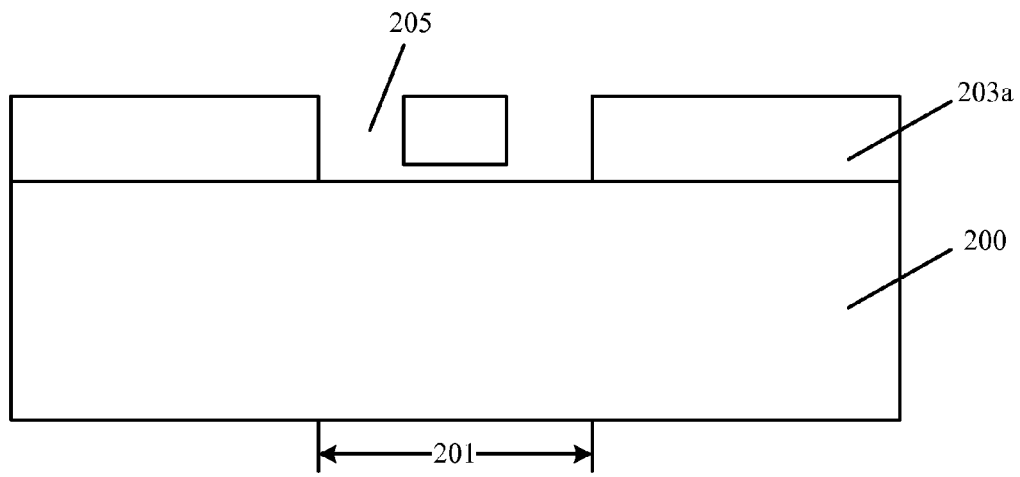
Figure 9:
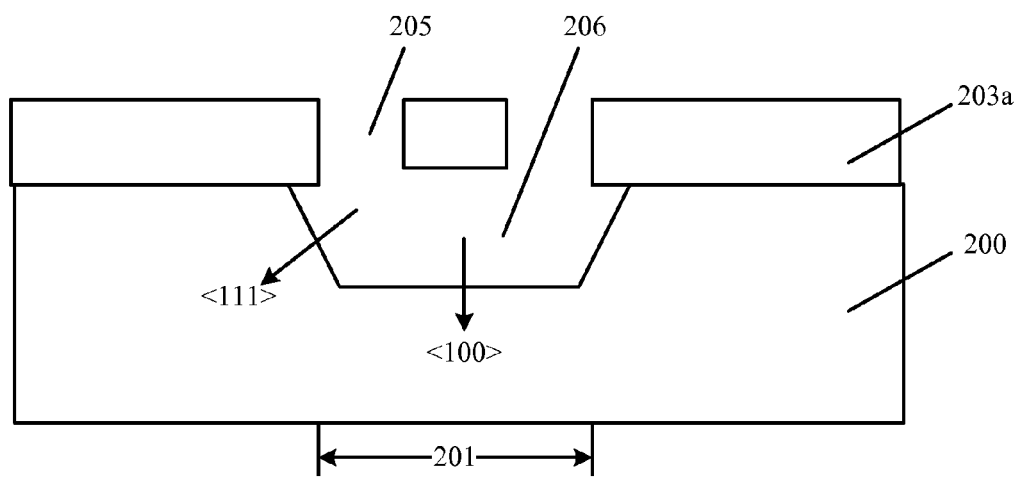
Figure 10:
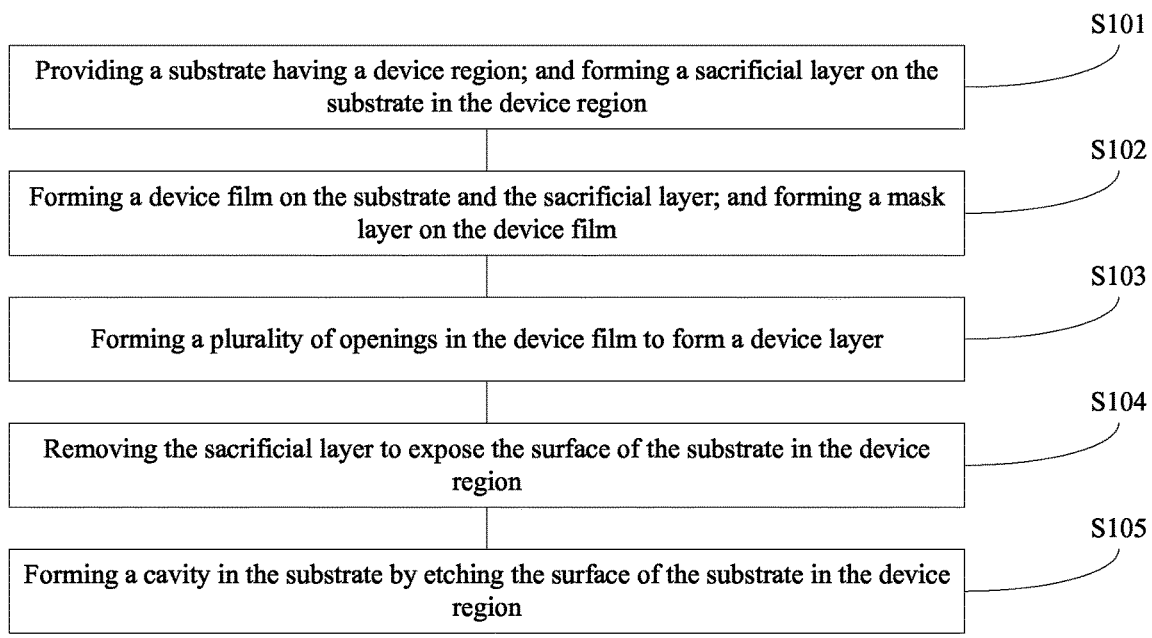
FIG. 10 illustrates an exemplary fabrication process of a semiconductor structure having a cavity consistent with the disclosed embodiments.

FIG. 10 illustrates an exemplary fabrication process of a semiconductor structure consistent with the disclosed embodiments; and FIGS. 5~9 illustrate semiconductor structures corresponding to certain stages of the exemplary fabrication process.

Figure 5:
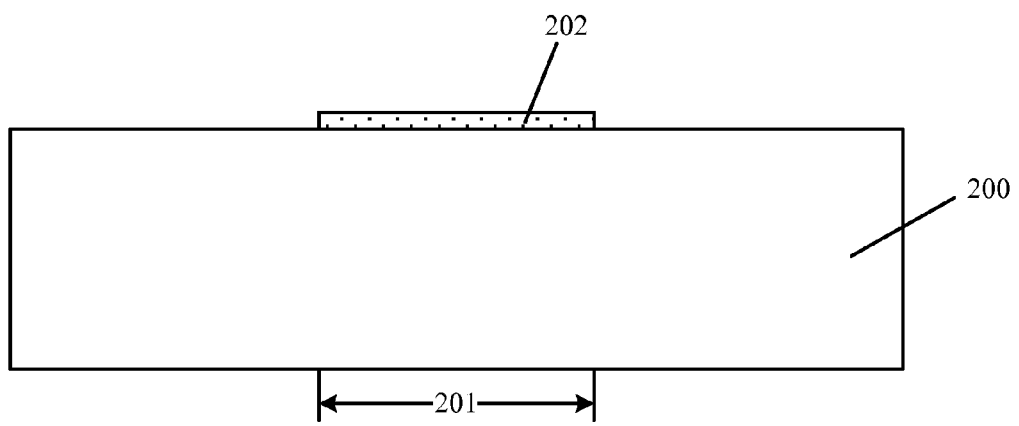
FIGS. 5~9 illustrate semiconductor structures corresponding to certain stages of an exemplary fabrication process of a semiconductor structure having a cavity consistent with the disclosed embodiments.

As shown in FIG. 10, at the beginning of fabrication process, a substrate with certain structures is provided (S101). FIG. 5 illustrates a corresponding semiconductor structure.

As shown in FIG. 5, a substrate 200 is provided. The substrate 200 may have a device region 201. Further, a sacrificial layer 202 may be formed on the surface of the substrate 200 in the device region 201.

In one embodiment, the substrate 200 may be a semiconductor substrate. A cavity may be subsequently formed in the semiconductor substrate. The semiconductor substrate may be made of any appropriate semiconductor materials, such as single crystal silicon, polysilicon, silicon on insulator (SOI), silicon germanium, carborundum, indium antimonite, lead telluride, indium arsenide, indium phosphate, gallium arsenide, gallium antimonite, alloy semiconductor or a combination thereof. The substrate 200 provides a base for subsequent devices and processes.

In one embodiment, the substrate 200 is a single crystal silicon substrate. The surface of the single crystal silicon substrate may have a <100> crystal orientation. A cavity may be subsequently formed in the substrate 200 by an anisotropic wet etching process. Because the anisotropic wet etching process may have an etching selectivity to different crystal orientations, the side and bottom surfaces of the subsequently formed cavity may have different constant crystal orientations, respectively. Thus, the side and bottom surfaces of the subsequently formed cavity may be significantly smooth.

In certain other embodiments, the substrate 200 may include a base substrate, and a semiconductor layer formed on the base substrate. The base substrate may be single crystal silicon, polysilicon, and silicon on insulator (SOI), silicon germanium, carborundum, indium antimonite, lead telluride, indium arsenide, indium phosphide, gallium arsenide, gallium antimonite, alloy semiconductor, glass, or a combination thereof. The semiconductor layer may be made of any appropriate material, such as silicon germanium, silicon carbide, or silicon germanium, etc.

The semiconductor layer may be formed on the base substrate by any appropriate process, such as an epitaxial growth process, etc. The surface of the semiconductor layer may be have a <100> crystal orientation. A cavity may be subsequently formed in the semiconductor layer. In one embodiment, the semiconductor layer is made of single crystal silicon.

The sacrificial layer 202 may cover the surface of the substrate 200 in the device region 201. A device layer may be subsequently formed on the surface of the sacrificial layer 202; and the sacrificial layer 202 may be subsequently removed. Thus, the surface of the substrate 200 in the device region 201 under the device layer may be subsequently exposed. A subsequent process for forming a cavity may be able to etch the entire exposed surface of the substrate 200. Thus, it may reduce the time for forming the cavity. Further, the undercut depth of the subsequently formed cavity under the device layer may also be reduced; and it may not leave residual material of the substrate 200 on the bottom surface of the device layer.

The sacrificial layer 202 may be made of a material different from the material of the subsequently formed device layer and the material of the substrate 200. Thus, the sacrificial layer 202 may have an etching selectivity to the substrate 200 and to the subsequently formed device layer. When the sacrificial layer 202 is subsequently removed, the process for removing the sacrificial layer 202 may generate substantially small damage to the device layer and the surface of the substrate 200. Thus, the surface of the substrate 200 under the device layer may be exposed.

The sacrificial layer 202 may be made of any appropriate material, such as amorphous silicon, amorphous carbon, amorphous silicon nitride, amorphous silicon oxynitride, amorphous silicon carbide, or amorphous silicon germanium, etc. In one embodiment, the sacrificial layer 202 is made of amorphous silicon. The substrate 200 may be made of single crystal silicon. Thus, a same wet etching process may be used to subsequently remove the sacrificial layer 202; and etch the substrate 200 to form a cavity in the substrate 200. Therefore, the fabrication process of the semiconductor structure may be simplified.

The thickness of the sacrificial layer 202 may be in a range of approximately 50 nm~100 nm. The sacrificial layer 202 may be relatively thin. Thus, it may be easy to subsequently remove the sacrificial layer 202. Once the sacrificial layer 202 is removed, the surface of the substrate 200 in the device region 201 may be exposed.

A process for forming the sacrificial layer 202 may include forming a sacrificial film (not labeled) on the surface of the substrate 200; forming a patterned photoresist layer (not shown) on the surface of the sacrificial film; and etching the sacrificial film using the patterned photoresist layer an etching mask until the surface of the substrate 200 is exposed. Thus, the sacrificial layer 202 may be formed.

The sacrificial film may be formed by any appropriate process, such as a chemical vapor deposition (CVD) process, a physical vapor deposition (PVD) process, an atomic layer deposition (ALD) process, or a flowable CVD (FCVD) process, etc. Various processes may be used to etch the sacrificial film, such as a dry etching process, a wet etching process, or an ion beam etching process.

Figure 6:
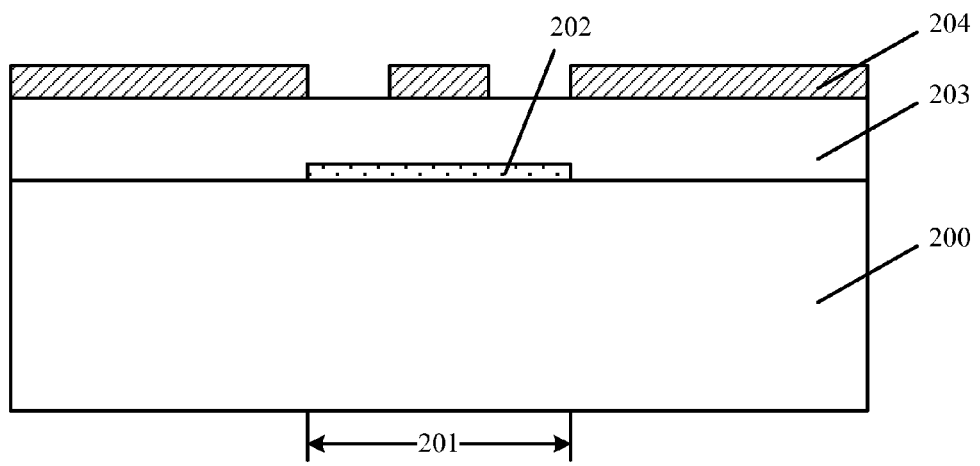

Returning to FIG. 10, after providing the substrate 200 and forming the sacrificial layer 202, a device film and a mask layer may be formed (S102). FIG. 6 illustrates a corresponding semiconductor structure.

As shown in FIG. 6, a device film 203 is formed on the surface of the substrate 200 and the sacrificial layer 202. Further, a mask layer 204 is formed on the surface of the device film 203. The mask layer 204 may expose a portion of the surface of the device film 203.

The device film 203 may be used to subsequently form a device layer. A portion of the device layer may suspend over the subsequently formed cavity. The device film 203 may be made of any appropriate material according to the function of the semiconductor structure. In one embodiment, the semiconductor structure may be used to form a humidity sensor. Thus, the device film 203 may be made of a humidity sensitive material. The humidity of the external environment may be detected by detecting certain parameters of the portion of the device layer suspending over the cavity.

In one embodiment, the device film 203 is made of silicon oxide. Silicon oxide is a humidity sensitive material. Various processes may be used to form the device film 203, such as a CVD process, a PVD process, an ALD process, or an FCVD process, etc. In one embodiment, the device film 203 is formed by a plasma-enhanced CVD (PECVD) process. Silicon oxide formed by PECVD process may have a significantly high density and significantly large hardness. Thus, the portion of the subsequently formed device layer suspending over the subsequently formed cavity may be uneasy to break and/or bend. Further, the density of the silicon oxide formed by the PECVD process may be uniform. It may ensure the electrical properties of the subsequently formed device layer to be significantly stable. Thus, the information detected by the sensor having such a device layer may be accurate.

The device film 203 may be formed by a single-time deposition process, or a multiple-time deposition process. In one embodiment, the device film 203 is formed by two times of PECVD process.

The pressure of the PECVD process may be in a range of approximately 1 Torr~10 Torr. The temperature of the PECVD process may be in a range of approximately 360° C.~420° C. The radio frequency power of the PECVD process may be in a range of approximately 400 W~2000 W. The reaction gas for forming silicon oxide by the PECVD process may include $O_2$, and tetraethyl orthosilicate (TEOS), etc. The flow rate of $O_2$ may be in a range of approximately 500 sccm~4000 sccm. The flow rate of TEOS may be in a range of approximately 500 sccm~5000 sccm. The carrier gas of the reaction gas may include He, etc. The flow rate of He may be in a range of approximately 1000 sccm~5000 sccm.

The mask layer 204 may be used as an etching mask for subsequently forming openings in the device layer. The mask layer 204 may expose the corresponding positions of the subsequently formed openings. The mask layer 204 may be made of a material different from that of the device film 203, such as silicon nitride, silicon oxynitride, or amorphous silicon, etc. The mask layer 204 made of such materials may be referred as a hard mask (HM). In one embodiment, the mask layer 204 is made of silicon nitride.

A process for forming the mask layer 204 may include sequentially forming a mask film on the device film 203; forming a patterned photoresist layer on the mask film; and etching the mask film using the patterned photoresist layer as an etching mask until the device film 203 is exposed. Thus, the mask layer 204 may be formed.

The mask film may be formed by any appropriate process, such as a CVD process, a PVD process, an ALD process, or an FCVD process, etc. Various processes may be used to etch the mask film to form the mask layer 204, such as a dry etching process, a wet etching process, or an ion beam etching process, etc.

Figure 7:
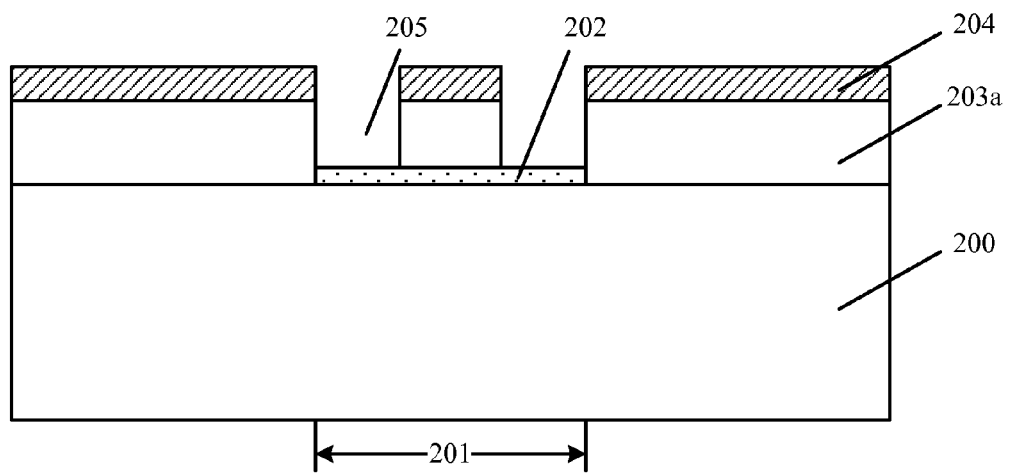

Returning to FIG. 10, after forming the mask layer 204, a plurality of openings may be formed in the device film 203 (S103). FIG. 7 illustrates a corresponding semiconductor structure.

As shown in FIG. 7, a plurality of openings 205 are formed in the device film 203. Thus, a device layer 203a is formed. The number of the openings 205 may be equal to or greater than two. In one embodiment, two openings 205 are formed in the device film 203 to form the device layer 203a.

The device layer 203a may be formed by etching the device film 203 using the mask layer 204 as an etching mask until the surface of the sacrificial layer 202 is exposed. An etching process may be subsequently performed to etch the sacrificial layer 202 and the substrate 200 such that the sacrificial layer 202 may be removed; and a cavity may be formed in the substrate 200 in the device region 201. The portion of the device layer 203a between the two openings 205 may be suspended over the subsequently formed cavity. The suspended portion of the device layer 203a may be used to detect the external information. In one embodiment, the semiconductor structure may be used as a humidity sensor; and the device layer 203a may be made of silicon oxide. Thus, the suspended portion of the device layer 203a may be used to detect the humidity information of the external environment.

The device film 203 may be etched by any appropriate process, such as a dry etching process, a wet etching process, or an ion beam etching process, etc. In one embodiment, an anisotropic dry etching process is used to etch the device film 203. Because the sacrificial layer 202 and the device film 203 may have an etching selectivity, the anisotropic dry etching process may stop on the surface of the sacrificial layer 202.

The etching gas of the anisotropic dry etching process may include one or more of $C_2F_6$, $CHF_3$, $CH_3F$, and $CF_4$, etc. The power of the anisotropic dry etching process may be greater than 500 W. The bias voltage of the anisotropic dry etching process may be greater than 100 V.

Returning to FIG. 10, after forming the device layer 203a and the openings 205, the sacrificial layer 202 may be removed (S104). FIG. 8 illustrates a corresponding semiconductor structure.

As show in FIG. 8, the sacrificial layer 202 is removed. In one embodiment, the mask layer 204 may be removed before removing the sacrificial layer 202.

Various processes may be used to remove the mask layer 204, such as a dry etching process, or a wet etching process, etc. In one embodiment, the mask layer 204 and the sacrificial layer 202 may be made of a same material. Thus, the mask layer 204 and the sacrificial layer 202 may be removed simultaneously.

In certain other embodiments, the mask layer 204 may be removed after removing the sacrificial layer 202. In certain still other embodiments, the mask layer 204 may be removed after subsequently forming a cavity.

The sacrificial layer 202 may be removed by an isotropic etching process. The isotropic etching process may have relatively large etching rates along both the direction perpendicular to the surface of the substrate 200 and the direction parallel to the surface of the substrate 200. Thus, the isotropic etching process may enter into the bottom of the device layer 203a between the openings 205 to etch the sacrificial layer 202. After removing the sacrificial layer 202, the surface of the substrate 200 in the device region 201 may be entirely exposed. A subsequent etching process may etch the exposed surface of the substrate 200 to form a cavity in the substrate 200. Thus, by forming, and then removing the sacrificial layer 202, the time for forming the cavity may be reduced. Further, the depth of the undercut under the device layer 203a may also be reduced.

In one embodiment, the sacrificial layer 202 may be made of amorphous silicon; and a wet etching process may be used to remove the sacrificial layer 202. The etching solution may be a tetramethylammonium hydroxide (TMAOH) solution. The mass percentile of the TMAOH solution may be in a range of approximately 15%~25%. The temperature of the TMAOH solution may be in a range of approximately 75° C.~85° C.

The sacrificial layer 202 may be made of amorphous silicon. The amorphous silicon may not have a long range crystal order. When the TMAOH solution is used to etch the amorphous silicon, the etching process may be an isotropic etching process. Thus, the sacrificial layer 202 may be entirely removed; and the exposed surface of the substrate 200 may be relatively even.

Further, the substrate 200 may be made of single crystal silicon. Thus, the TMAOH may also be used to subsequently etch the substrate 200. When the TMAOH is used to subsequently etch the substrate 200 made of single crystal silicon to form a cavity, the wet etching process using TMAOH may be an anisotropic etching process. Thus, the side and bottom surfaces of the cavity formed by the wet etching process using TMAOH may have constant crystal orientations. That is, the side and bottom surfaces of the cavity may be significantly smooth. When the etching solution of the wet etching process for removing the sacrificial layer 202 is identical to the etching solution of the wet etching process for subsequently forming the cavity, the fabrication process of the semiconductor structure may be simplified.

Returning to FIG. 10, after removing the sacrificial layer 202, a cavity may be formed in the substrate 200 (S105). FIG. 9 illustrates a corresponding semiconductor structure.

As show in FIG. 9, the surface of the substrate 200 in the device region 201 is etched; and a cavity 206 is formed in the substrate 200. The surface of the substrate 200 may be etched by any appropriate process. In one embodiment, an anisotropic wet etching process is used to etch the surface of the substrate 200 in the device region 201.

The anisotropic wet etching process may have different etching rates along different crystal orientations. Thus, the side and bottom surfaces of the cavity 206 may have constant crystal orientations. In one embodiment, the surface of the substrate 200 may have a <100> crystal orientation. Referring to FIG. 9, the anisotropic wet etching process may have a relatively large etching rate along the <100> crystal orientation; and may have a relatively low etching rate along the <111> orientation. Thus, the bottom surface of the cavity 206 may have a <100> crystal orientation after the anisotropic wet etching process. The side surfaces of the cavity 206 may have a <111> crystal orientation after the anisotropic wet etching process. Because the side and bottom surfaces of the cavity 206 may have the constant crystal orientations, the side and bottom surfaces of the cavity 206 may be significantly smooth.

Further, the sacrificial layer 202 under the device layer 203a may be removed before forming the cavity 206; and the surface of the substrate 200 in the device region 201 may be entirely exposed. Thus, the etching solution of the anisotropic wet etching process may enter under the device layer 203a; and contact with the surface of the substrate 200. Because the contact area between the etching solution and the surface of the substrate 200 under the device region 203a may be relatively large, the etching time for forming the cavity 206 may be reduced. Further, the bottoms of the two openings 205 may be connected by the cavity 206. Thus, the device layer 203a may be suspended over the cavity 206.

Further, referring to FIG. 9, the anisotropic wet etching process may have a relatively low etching rate along the <111> crystal orientation. When the substrate 200 is being downwardly etched from the surface of the substrate 200, the side surfaces of the cavity 206 may be etched with a substantially low etching rate. Thus, the distance between the top of the side surface of the cavity 206 and the sidewall of the openings 205 may be relatively small. That is, the undercut of the top of the cavity 206 may be reduced. Therefore, it may be easy to control the width of the cavity 206.

Therefore, the performance of the semiconductor device having such a cavity 206 may be significantly stable. Further, the external information detected by the sensor having such a semiconductor structure may be significantly accurate.

In certain other embodiments, the substrate 200 may include a base substrate and a semiconductor layer formed on the surface of the base substrate. The semiconductor layer may be made of single crystal silicon. Further, the surface of the semiconductor layer may have a <100> crystal direction. Thus, an anisotropic wet etching process may be used to etch the semiconductor layer to form a cavity in the semiconductor layer.

The etching solution of the anisotropic wet etching process may include any appropriate chemicals. In one embodiment, the etching solution of the anisotropic wet etching process is a TMAOH solution. The mass percentile of the TMAOH may be in a range of approximately 15%~25%. The temperature of the TMAOH solution may be in a range of approximately 75° C.~85° C.

Referring to FIG. 9, the side surfaces of the cavity 206 may have a <111>crystal orientation. The side surfaces of the cavity 206 may incline with the surface of the substrate 200. That is, the top portion of the cavity 206 may be greater than the bottom portion of the cavity 206. The acute angle between the side surface of the cavity 206 and the surface of the substrate 200 may be in a range of approximately 45°~55°. The depth of the cavity 206 may be any appropriate value. In one embodiment, the depth of the cavity 206 may be approximately 6 µm; and the angle between the side surface of the cavity 206 and the surface of the substrate 200 may be approximately 54°.

In one embodiment, the temperature of the process for forming the sacrificial layer 202, the temperature of the process for forming the device layer 203a, the temperature of the process for forming the openings 205, the temperature of the process for removing the sacrificial layer 202, and the temperature of the process for forming the cavity 206 may all be lower than 450° C. After such processes with the relatively temperature, the electrical properties of the device layer 203a made of silicon oxide may be barely changed. Thus, the humidity sensor formed by the semiconductor structure may be able to obtain significantly accurate humidity information.

Thus, a semiconductor structure may be formed by the above disclosed processes and methods; and the corresponding semiconductor structure is illustrated in FIG. 9. As shown in FIG. 9, the semiconductor structure includes a substrate 200 having a device region 201. The semiconductor structure also includes a cavity 206 with side and bottom surfaces having constant crystal orientations formed in the substrate 200 in the device region 201. Further, the semiconductor structure includes a device layer 203a formed on the substrate 200 and with a portion suspended over the cavity 206. The detailed structures and intermediate structures are described above with respect to the fabrication processes.

According to the disclosed methods and structures, a sacrificial layer may be formed on the surface of the substrate in the device region before forming the device layer. After forming openings exposing the sacrificial layer in the device layer, the sacrificial layer may be removed. Thus, the surface of the substrate in the device region may be entirely exposed. The etching solution of the wet etching process for forming a cavity in the substrate may enter under the device layer to contact with the surface of the substrate in the device region. Because the etching solution and the expose surface of the substrate may have a relatively large contact area (etching area), the etching time for forming the cavity may be reduced.

Further, the etching process may start from the exposed surface of the substrate. Thus, the depth of the cavity may unnecessarily be significantly large. Correspondingly, the etching time for forming the cavity may be relatively short. Therefore, the undercut of the side surfaces of the cavity relative to the side surfaces of the openings may be relatively small.

Therefore, the morphology of the semiconductor structure formed by the disclose processes may be improved. The performance of the sensors having such a semiconductor structure may be improved as well. Further, the fabrication time of the semiconductor structure may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate having a device region;
   forming a sacrificial layer on a surface of the substrate in the device region;
   forming a device layer having a plurality of openings exposing a portion the sacrificial layer on the sacrificial layer;
   removing the sacrificial layer to expose the surface of the substrate in the device region; and
   forming a cavity in the substrate in the device region by simultaneously etching the surface of the substrate in the device region exposed by the removed sacrificial layer and the plurality of openings using an anisotropic etching process.

2. The method according to claim 1, wherein:
   the sacrificial layer is removed by an isotropic etching process.

3. The method according to claim 1, wherein:
   the sacrificial layer is made of a material different from that of the device layer; and
   the sacrificial layer is made of a material different from that of the substrate.

4. The method according to claim 3, wherein:
   the sacrificial layer is made of amorphous silicon;
   a wet etching process is used to remove the sacrificial layer; and
   an etching solution of the wet etching process is a tetramethylammonium hydroxide (TMAOH) solution.

5. The method according to claim 1, wherein:
   the cavity is formed by an anisotropic wet etching process.

6. The method according to claim 5, wherein:
   the substrate is a semiconductor substrate; and
   a surface of the semiconductor substrate has a <100> crystal orientation.

7. The method according to claim 6, wherein:
   the semiconductor substrate is made of single crystal silicon; and an etching solution of the anisotropic wet etching process is a tetramethylammonium hydroxide (TMAOH) solution.

8. The method according to claim 5, wherein:
the substrate include a base substrate and a semiconductor layer formed on the base substrate; and
a surface of the semiconductor layer has a <100> crystal orientation.

9. The method according to claim 8, wherein:
the semiconductor layer is made of one of silicon, germanium, silicon carbide and silicon germanium; and
the semiconductor layer is formed by an epitaxial growth process.

10. The method according to claim 9, wherein:
the semiconductor layer is made of single crystal silicon; and
an etching solution of the anisotropic wet etching process is a tetramethylammonium hydroxide (TMAOH) solution.

11. The method according to claim 7, wherein:
a mass percentile of the tetramethylammonium hydroxide (TMAOH) solution is in a range of approximately 15%~25%; and
a temperature of the TMAOH solution is in a range of approximately 75° C.~85° C.

12. The method according to claim 11, wherein forming the device layer further includes:
forming a device film on the surfaces of the substrate and the sacrificial layer;
forming a mask layer exposing portions of a surface of the device film on the device film; and
etching the device film using the mask layer as an etching mask until the surface of the sacrificial layer is exposed to form the device layer and the plurality of openings.

13. The method according to claim 12, wherein:
the device film is formed by a plasma enhanced chemical vapor deposition process.

14. The method according to claim 1, wherein:
a number of the plurality of openings is equal to, or greater than two.

15. The method according to claim 1, wherein:
a temperature of a process for forming the sacrificial layer, a temperature of a process for forming the device layer, a temperature of a process for forming the openings, a temperature of a process for removing the sacrificial layer, and a temperature of a process for forming the cavity are lower than approximately 450° C.

* * * * *